(12) United States Patent
Cooper et al.

(10) Patent No.: US 8,440,543 B2
(45) Date of Patent: May 14, 2013

(54) HYBRID CIRCUIT STRUCTURE AND PARTIAL BACKFILL METHOD FOR IMPROVING THERMAL CYCLING RELIABILITY OF SAME

(75) Inventors: Donald E. Cooper, Moorpark, CA (US); William E. Tennant, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 13/236,421

(22) Filed: Sep. 19, 2011

(65) Prior Publication Data
US 2013/0069192 A1 Mar. 21, 2013

(51) Int. Cl.
*H01L 21/46* (2006.01)
*H01L 23/34* (2006.01)
*H01L 23/04* (2006.01)
*B32B 37/00* (2006.01)

(52) U.S. Cl.
USPC ........... 438/455; 438/456; 257/723; 257/730; 156/182

(58) Field of Classification Search .................. 156/182; 257/678–733; 438/57, 64–67, 73, 107, 455
See application file for complete search history.

(56) References Cited

U.S. PATENT DOCUMENTS

| | | | |
|---|---|---|---|
| 5,308,980 A | 5/1994 | Barton | 250/338.4 |
| 5,473,187 A | 12/1995 | Baker et al. | 257/643 |
| 5,585,624 A | 12/1996 | Asatourian et al. | 250/216 |
| 5,627,082 A | 5/1997 | Beratan et al. | 438/55 |
| 6,262,513 B1 * | 7/2001 | Furukawa et al. | 310/313 R |
| 6,759,307 B1 * | 7/2004 | Yang | 438/455 |
| 6,800,946 B2 * | 10/2004 | Chason et al. | 257/778 |
| 7,195,361 B2 | 3/2007 | Ealey | 359/849 |
| 7,479,627 B2 * | 1/2009 | Yoshimoto et al. | 250/239 |
| 7,804,161 B2 * | 9/2010 | Saeki | 257/667 |

\* cited by examiner

*Primary Examiner* — Julio J Maldonado
*Assistant Examiner* — Cory Eskridge
(74) *Attorney, Agent, or Firm* — Koppel, Patrick, Heybl & Philpott

(57) ABSTRACT

A method of improving thermal cycling reliability for a hybrid circuit structure requires providing at least two circuit layers, aligning two of the circuit layers vertically such that their respective circuit elements have a precise and well-defined spatial relationship, and providing an adhesive material which wicks into a portion of the space between the aligned layers so as to mitigate damage to the structure and/or interconnections that might otherwise occur due to thermal contraction mismatch between the layers. The adhesive material is required to have an associated viscosity such that, when provided under predetermined conditions, the adhesive stops wicking before reaching, and possibly degrading the performance of, the circuit elements.

18 Claims, 2 Drawing Sheets

HYBRID CIRCUIT STRUCTURE AND PARTIAL BACKFILL METHOD FOR IMPROVING THERMAL CYCLING RELIABILITY OF SAME

BACKGROUND OF THE INVENTION

1. Field of the Invention

This invention relates generally to hybrid circuits, and more particularly, to methods of reducing circuit failures due to thermal contraction mismatch between the different layers of the hybrid circuit.

2. Description of the Related Art

Hybrid circuits are made up of two or more distinct circuit layers that are typically fabricated separately, but are then joined together physically and electrically to form a device. For example, a photodetector layer and a readout IC (ROIC) layer may be packaged together and electrically interconnected to form a hybrid focal plane array (FPA) device.

Such devices are often subjected to temperatures that change over time. If the interconnected layers react differently to changes in temperature—i.e., if there is, for example, a "thermal contraction mismatch" between the layers—the device may fail at the interface between the layers due to the stress on the interconnections under thermal stress. One approach to minimizing such failures is by attempting to carefully match the thermal contraction characteristics of the interconnected layers. Another technique requires using thermal matching structures to compress one layer in an attempt to match its contraction to that of another layer. These approaches may be adequate for a few hundred thermal cycles, but are unlikely to prevent failures at the interface for devices subjected to thousands of cycles.

Another approach that has been taken to reduce thermal cycling failures at the interface between layers is to introduce an adhesive such as a low-viscosity non-conductive epoxy between the layers, which serves to hold the layers together and to relieve stress on the interconnections between the layers. However, such an adhesive 'backfill' may also tend to degrade the performance of any circuit elements contacted by the epoxy. For example, for a hybrid FPA device, epoxy backfill that comes into contact with the individual photodetectors on the photodetector layer may degrade the detector's performance. This can be particularly problematic when the photodetector layer is non-planar—i.e., with raised "mesa" features that are separated by lower regions—as such photodetector layers are often especially susceptible to degradation due to contact with an epoxy backfill.

SUMMARY OF THE INVENTION

A method of improving thermal cycling reliability for a hybrid circuit structure is presented which overcomes the problems noted above, in that the method enables an adhesive to be used between circuit layers which reduces failures due to thermal contraction mismatch, without degrading the performance of the hybrid device.

The present method requires providing at least two circuit layers, aligning two of the circuit layers vertically such that their respective circuit elements have a precise and well-defined spatial relationship, and providing an adhesive material such that the adhesive wicks into a portion of the space between the aligned circuit layers so as to mitigate damage to the structure and/or interconnections that might otherwise occur due to thermal contraction mismatch between the aligned layers. The adhesive material, typically an epoxy, is required to have an associated viscosity such that, when provided under predetermined conditions, the adhesive material stops wicking before reaching—and possibly degrading the performance of—the circuit elements.

The present method is particularly well-suited to use with a hybrid FPA, such as a 2-color detector, with the aligned circuit layers being a planar or non-planar photodetector layer and an ROIC layer. For this application, the adhesive material has a viscosity such that, when provided under predetermined conditions, the adhesive material stops wicking before reaching any of the plurality of photodetectors on the photodetector layer.

These and other features, aspects, and advantages of the present invention will become better understood with reference to the following drawings, description, and claims.

DETAILED DESCRIPTION OF THE INVENTION

The present method and resulting structure improves the thermal cycling reliability of hybrid devices, by introducing an adhesive material at the edges of the circuit layers making up the device, while avoiding adhesive contact with the layers' circuit elements. The adhesive serves to improve thermal cycling reliability by holding the layers together and thereby relieving stress on the interconnections between the layers that might otherwise occur due to thermal contraction mismatch, while also being arranged to stop wicking before reaching or degrading the performance of any circuit elements due to contact with the adhesive.

The present method is applicable for use with any hybrid structure made from at least two stacked circuit layers, each of which contains a plurality of circuit elements, with electrical connections interconnecting the circuit elements of one layer with those on another layer. The circuit layers are aligned vertically such that their respective circuit elements have a precise and well-defined spatial relationship; when the layers are electrically interconnected, the alignment ensures that the layers are arranged such that circuit nodes from respective layers which are to be connected together are properly aligned. For example, if the hybrid device is a hybrid focal plane array (FPA), which includes a layer containing a plurality of photodetectors and a layer containing a plurality of readout IC (ROIC) input nodes, aligning the layers vertically requires that the photodetectors and input nodes have a precise and well-defined spatial relationship, with each individual detector aligned to a corresponding ROIC input node.

With the circuit layers properly aligned, an adhesive material is provided at the edges of the layers such that it wicks into a portion of the space between the aligned circuit layers. To avoid degrading the circuit elements, the adhesive is provided with a viscosity selected such that, when applied under predetermined conditions, the depth to which the adhesive penetrates the gap between the layers is known and controlled, such that it stops wicking before reaching the circuit elements and thus avoids any degradation to the circuitry. In addition, the adhesive material serves to hold the layers together and thereby relieve stress on the interconnections that might otherwise occur due to thermal contraction mismatch between the aligned layers.

Figure 1A:
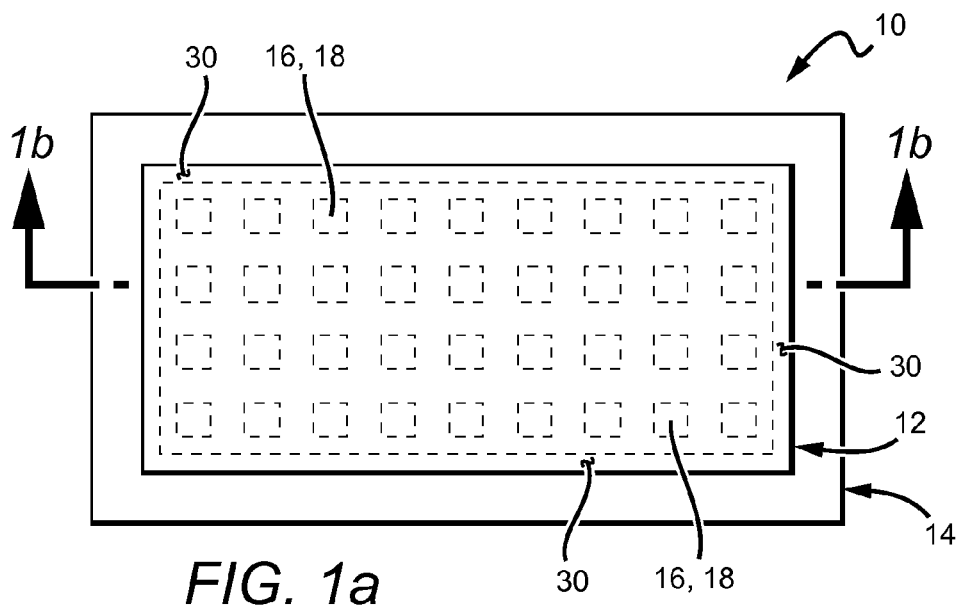
FIG. 1*a* is a plan view of a hybrid structure in accordance with the present invention.

The present method and structure are illustrated in FIGS. 1a (plan view) and 1b (sectional view). Here, the hybrid structure 10 includes two circuit layers 12, 14, each of which includes circuit elements 16, 18. For example, layer 12 may contain a plurality of photodetectors 16, and layer 14 may contain a plurality of ROIC input nodes 18. The circuit elements on the respective layers are interconnected, here by means of solder bumps 24, 26. Layers 12 and 14 must be aligned such that the interconnections between the layers can be effected.

Once aligned, an adhesive material 30 is introduced into the space 32 between the layers such that the adhesive wicks into a portion of space 32. Adhesive 30 serves to mechanically bond layers 12 and 14 together and to relieve stress on the interconnections (24, 26) between them, so as to mitigate damage to the structure that might otherwise occur due to thermal contraction mismatch between the aligned layers. And as noted above, adhesive material 30 has an associated viscosity which is selected such that, when provided under predetermined conditions, the adhesive stops wicking before reaching circuit elements 16, 18.

Adhesive material 30 is preferably an epoxy. An epoxy with a relatively high viscosity is preferred, which tends to limit the depth to which the epoxy wicks into space 32; one suitable epoxy is 3M™ Scotch-Weld™ Epoxy Adhesive 2216. To precisely control the depth of penetration, both the adhesive's viscosity and the temperature at which the adhesive is applied must be controlled. Penetration depths of as little as a few tenths of a millimeter are possible.

The present method is particularly well-suited to use with a hybrid structure in which one or more of the circuit layers is non-planar—i.e., with raised "mesa" features that are separated by lower regions. For example, a hybrid FPA may be a 2-color detector, which may have a non-planar photodetector layer. The performance of non-planar photodetectors has been known to become degraded if it comes into contact with a backfilled adhesive. The present method serves to avoid this degradation.

Figure 1B:
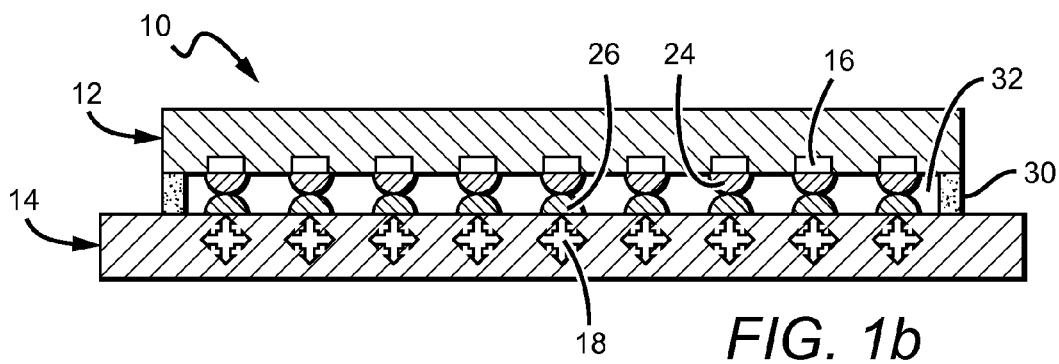
FIG. 1*b* is a sectional view of the hybrid structure of FIG. 1*a*.
Figure 2A:
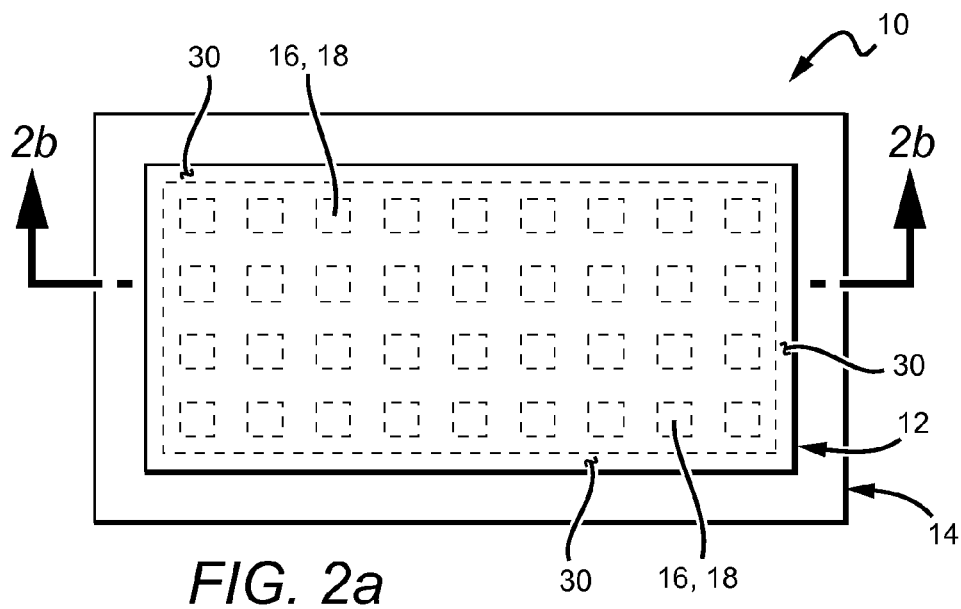
FIG. 2*a* is a plan view of a hybrid structure which includes a non-planar layer in accordance with the present invention.

An exemplary embodiment of a hybrid structure in accordance with the present method and having a non-planar circuit layer is shown in FIGS. 2a (plan view) and 2b (sectional view). The structure is similar to that shown in FIGS. 1a and 1b, except that circuit layer 40 is non-planar; for example, layer 40 may be a photodetector layer, with mesa regions 42 separated by lower regions 44.

Figure 2B:
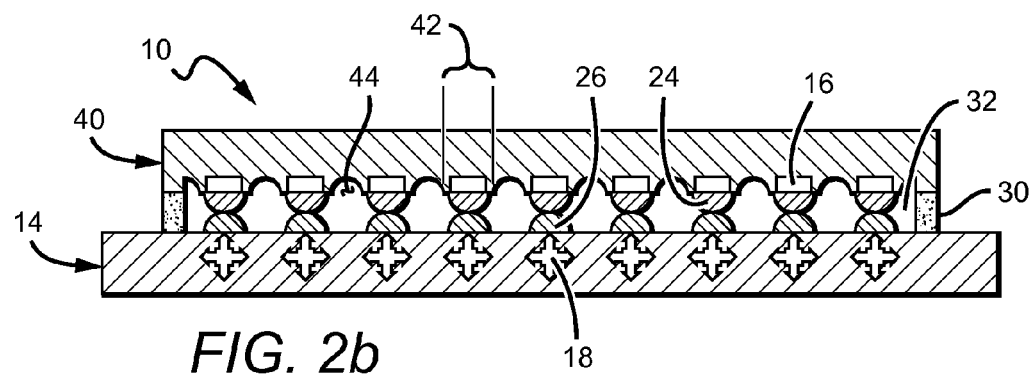
FIG. 2*b* is a sectional view of the hybrid structure of FIG. 2*a*.
Figure 3:
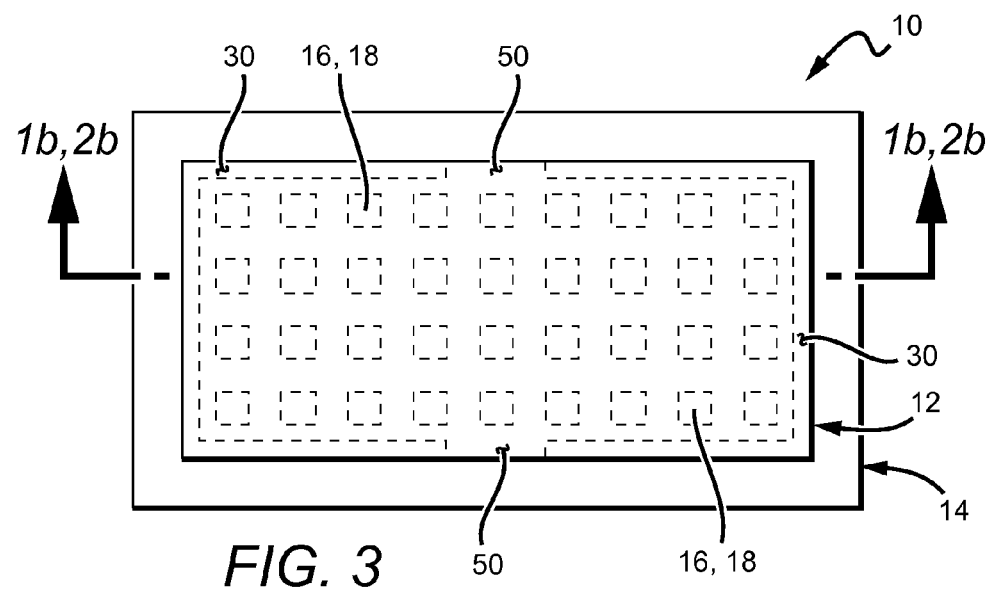
FIG. 3 is a plan view of another possible embodiment of a hybrid structure in accordance with the present invention.

Another possible embodiment of a hybrid structure in accordance with the present method requires that the adhesive not be present around the entire perimeter of the structure; a plan view of such an embodiment is shown in FIG. 3. Here, there are gaps 50 in the adhesive 30 used to mechanically bond layers 12 and 14 together and to relieve stress on the interconnections between them. The gaps act as vents for the space between the layers. A sectional view of the embodiment shown in FIG. 3 could be in accordance with the planar embodiment shown in FIG. 1b, or the non-planar embodiment shown in FIG. 2b.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of improving thermal cycling reliability for a hybrid circuit structure, comprising:
    providing at least two circuit layers, each of which contains a plurality of circuit elements;
    aligning two of said circuit layers vertically such that their respective circuit elements have a defined spatial relationship; and
    providing an adhesive material such that said adhesive material wicks into a portion of the space between said aligned circuit layers so as to mitigate damage to said structure that might otherwise occur due to thermal contraction mismatch between said aligned layers;
    said adhesive material having an associated viscosity such that said adhesive material stops wicking before reaching said circuit elements.

2. The method of claim 1, wherein said adhesive material is an epoxy adhesive.

3. The method of claim 1, wherein said aligned circuit layers comprise a photodetector layer and a readout integrated circuit (ROIC) layer and said hybrid circuit structure is a hybrid focal plane array (FPA).

4. The method of claim 3, wherein said photodetector layer comprises a plurality of photodetectors, said adhesive material having an associated viscosity such that said adhesive material stops wicking before reaching any of said plurality of photodetectors.

5. The method of claim 1, wherein said adhesive material mechanically bonds said aligned layers together.

6. The method of claim 1, wherein at least one of the layer surfaces in contact with said adhesive material is non-planar.

7. The method of claim 1, wherein said step of providing an adhesive material such that said adhesive material wicks into a portion of the space between said aligned circuit layers is performed such that there is no adhesive material in at least one portion of the space between said aligned circuit layers, so as to provide a vent for the space between said layers.

8. A method of improving thermal cycling reliability for a hybrid focal plane array (FPA) structure that includes a readout integrated circuit (ROIC) layer and a photodetector layer comprising a plurality of photodetectors, comprising:
    providing an ROIC layer which includes a plurality of input nodes;
    providing a photodetector layer which includes a plurality of photodetectors;
    aligning said photodetector and ROIC layers vertically such that each detector in said photodetector layer is vertically aligned with at least one input node of said ROIC layer;
    providing an interconnection means between said photodetector and ROIC layers; and
    providing an epoxy adhesive material such that said adhesive material wicks into a portion of the space between said layers so as to mitigate damage to the interconnections that might otherwise occur due to thermal contraction mismatch between said aligned layers;
    said epoxy adhesive material having an associated viscosity such that said adhesive material stops wicking before reaching any of said plurality of photodetectors.

9. The method of claim 8, wherein said hybrid FPA is a 2-color detector.

10. A hybrid circuit structure which includes at least two circuit layers, comprising:
    first and second circuit layers, each of which consists of a plurality of circuit elements and which are aligned vertically such that their respective circuit elements have a defined spatial relationship;

an interconnection means between said aligned circuit layers; and an adhesive material wicked between said aligned circuit layers so as to mitigate damage to said hybrid structure that might otherwise occur due to thermal contraction mismatch between said layers;

said adhesive material having an associated viscosity such that said adhesive material wicks into a portion of the space between said aligned layers and stops wicking before reaching any of said circuit elements.

11. The structure of claim 10, wherein said adhesive material is an epoxy adhesive.

12. The structure of claim 10, wherein first and second circuit layers comprise a photodetector layer and a readout integrated circuit (ROIC) layer and said hybrid circuit structure is a hybrid focal plane array (FPA).

13. The structure of claim 12, wherein said photodetector layer comprises a plurality of photodetectors, said adhesive material having an associated viscosity such that said adhesive material stops wicking before reaching any of said plurality of photodetectors.

14. The structure of claim 10, wherein said adhesive material mechanically bonds said aligned circuit layers together.

15. The structure of claim 10, wherein at least one of the layer surfaces in contact with said adhesive material is non-planar.

16. The structure of claim 10, wherein adhesive material wicked between said aligned circuit layers is arranged such that there is no adhesive material in at least one portion of the space between said aligned circuit layers, so as to provide a vent for the space between said layers.

17. A hybrid focal plane array (FPA) structure, comprising:
a readout integrated circuit (ROIC) layer which includes a plurality of input nodes;

a photodetector layer comprising a plurality of photodetectors, said ROIC and photodetector layers aligned vertically such that each detector of said photodetector layer is vertically aligned with at least one input node of said ROIC layer;

an interconnection means between said photodetector and ROIC layers; and an epoxy adhesive material provided at said aligned edges and wicked into a portion of the space between said layers so as to mitigate damage to said interconnection means that might otherwise occur due to thermal contraction mismatch between said layers;

said epoxy adhesive material having an associated viscosity such that said adhesive material stops wicking before reaching any of said plurality of photodetectors.

18. The hybrid FPA structure of claim 17, wherein said hybrid FPA is a 2-color detector.

* * * * *